US008665429B2

(12) United States Patent
Jiang et al.

(10) Patent No.: US 8,665,429 B2
(45) Date of Patent: Mar. 4, 2014

(54) METHOD FOR MEASURING LIGHT INTENSITY DISTRIBUTION

(71) Applicants: Kai-Li Jiang, Beijing (CN); Jun Zhu, Beijing (CN); Chen Feng, Beijing (CN); Shou-Shan Fan, Beijing (CN)

(72) Inventors: Kai-Li Jiang, Beijing (CN); Jun Zhu, Beijing (CN); Chen Feng, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/729,522

(22) Filed: Dec. 28, 2012

(65) Prior Publication Data
US 2013/0327937 A1    Dec. 12, 2013

(30) Foreign Application Priority Data

Jun. 12, 2012   (CN) .......................... 2012 1 01920647

(51) Int. Cl.
*G01J 1/00*   (2006.01)
*G01J 1/42*   (2006.01)

(52) U.S. Cl.
CPC .................................... *G01J 1/4257* (2013.01)
USPC ......................................... 356/213; 356/218

(58) Field of Classification Search
CPC ..................................................... G01J 1/4257
USPC ................................................... 356/213–223
See application file for complete search history.

(56) References Cited

U.S. PATENT DOCUMENTS

| | | | | |
|---|---|---|---|---|
| 8,077,318 | B2 * | 12/2011 | Luo et al. | 356/445 |
| 2010/0065190 | A1 * | 3/2010 | Cheng et al. | 156/152 |
| 2010/0277735 | A1 * | 11/2010 | Luo et al. | 356/400 |
| 2010/0296088 | A1 * | 11/2010 | Xiao et al. | 356/319 |
| 2011/0063613 | A1 * | 3/2011 | Sun et al. | 356/301 |

* cited by examiner

*Primary Examiner* — Michael P Stafira
(74) *Attorney, Agent, or Firm* — Altis Law Group, Inc.

(57) ABSTRACT

A method for measuring intensity distribution of light includes a step of providing a carbon nanotube array having a top surface. The carbon nanotube array is located in an inert gas environment or a vacuum environment. A light source irradiates the top surface of the carbon nanotube array, to make the carbon nanotube array radiate a radiation light. An imaging element images the radiation light, to obtain an intensity distribution of the light source.

20 Claims, 7 Drawing Sheets

METHOD FOR MEASURING LIGHT INTENSITY DISTRIBUTION

RELATED APPLICATIONS

This application claims all benefits accruing under 35 U.S.C. §119 from China Patent Application No. 201210192064.7, filed on Jun. 12, 2012 in the China Intellectual Property Office. This application is related to commonly-assigned application entitled, "METHOD FOR MEASURING LIGHT INTENSITY DISTRIBUTION", filed Ser. No. 13/729,300; "SYSTEM FOR MEASURING LIGHT INTENSITY DISTRIBUTION", filed Ser. No. 13/729,285; "SYSTEM FOR MEASURING LIGHT INTENSITY DISTRIBUTION", filed Ser. No. 13/729,279. Disclosures of the above-identified applications are incorporated herein by reference.

BACKGROUND

1. Technical Field

The present application relates to a method for measuring light intensity distribution.

2. Discussion of Related Art

To measure an intensity distribution of a light source, a sensor is sometimes put in a position away from the light source in some related art. Then the sensor is moved around a circumference of a circle with the light source as a center of the circle. It is necessary to move the sensor to obtain multiple testing data while measuring the intensity distribution of a light source.

The sensors used in measuring intensity distribution of light source can be classified into two types: thermal and photonic. The thermal sensors are low-cost and can be operated at room temperature but have low sensitivity and low response speed. The photonic sensors have high sensitivity and high response speed. However, the photonic sensors are high-cost and cannot be operated at room temperature.

What is needed, therefore, is to provide method of high sensitivity and high resolution for measuring intensity distribution of light at room temperature at a low-cost.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
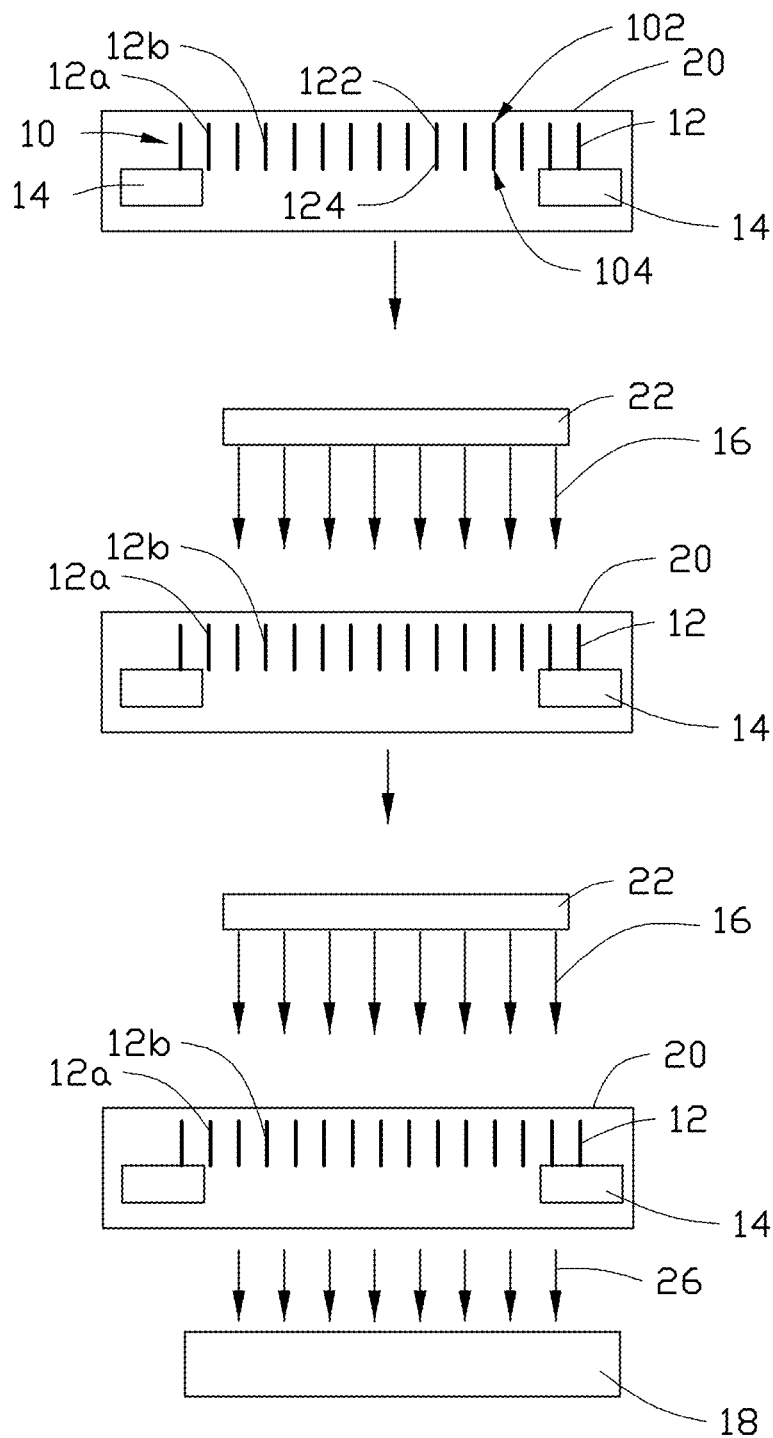
FIG. 1 is a flowchart of one embodiment of a method for measuring light intensity distribution.

Referring to FIG. 1, a method for measuring light intensity distribution of one embodiment includes the following steps:

(S1), suspending a carbon nanotube array 10 in an inert gas environment or a vacuum environment, wherein the carbon nanotube array 10 has a top surface 102;

(S2), irradiating the top surface 102 of the carbon nanotube array 10 with a light source 22 to make the carbon nanotube array 10 radiate a radiation light 26;

(S3), imaging the radiation light 26 radiated by the carbon nanotube array 10 with an imaging element 18 to obtain an intensity distribution of the light source 22.

Figure 2:
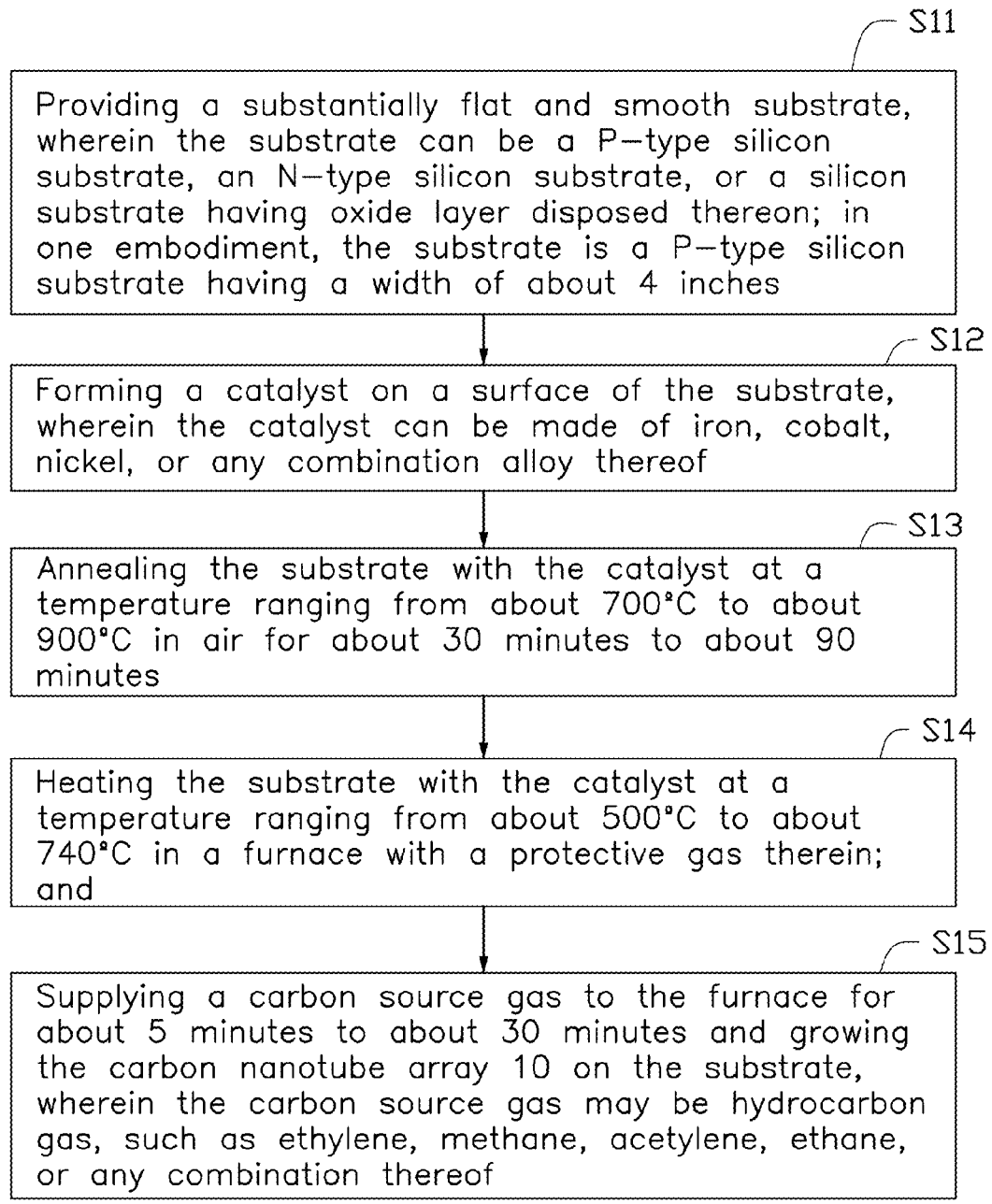
FIG. 2 is a flowchart of one embodiment of a method for making a carbon nanotube array.
Figure 3:
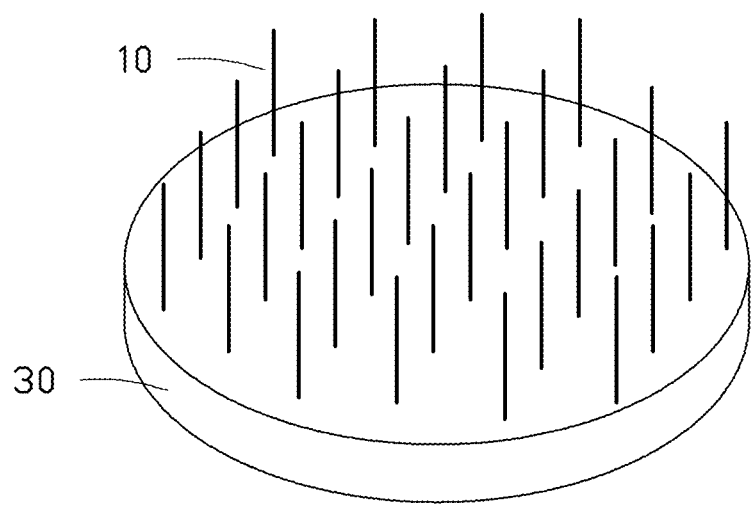
FIG. 3 is a schematic view of the carbon nanotube array of FIG. 2 located on a substrate.

Referring to FIGS. 2 and 3, in step (S1), the carbon nanotube array 10 is made by chemical vapor deposition process (CVD) in one embodiment. The chemical vapor deposition process includes the steps of:

(S11), providing a substantially flat and smooth substrate 30, wherein the substrate 30 can be a P-type silicon substrate 30, an N-type silicon substrate 30, or a silicon substrate 30 having oxide layer disposed thereon; in one embodiment, the substrate 30 is a P-type silicon substrate 30 having a width of about 4 inches;

(S12), forming a catalyst on a surface of the substrate 30, wherein the catalyst can be made of iron, cobalt, nickel, or any combination alloy thereof;

(S13), annealing the substrate 30 with the catalyst at a temperature ranging from about 700° C. to about 900° C. in air for about 30 minutes to about 90 minutes;

(S14), heating the substrate 30 with the catalyst at a temperature ranging from about 500° C. to about 740° C. in a furnace with a protective gas therein; and (S15), supplying a carbon source gas to the furnace for about 5 minutes to about 30 minutes and growing the carbon nanotube array 10 on the substrate 30, wherein the carbon source gas may be hydrocarbon gas, such as ethylene, methane, acetylene, ethane, or any combination thereof.

Moreover, the carbon nanotube array 10 formed under the above conditions is essentially free of impurities such as carbonaceous or residual catalyst particles.

In step (S1), the carbon nanotube array 10 includes a plurality of carbon nanotubes 12 substantially parallel to each other. The plurality of carbon nanotubes 12 may be single-walled, double-walled, multi-walled carbon nanotubes, or any combination thereof. The plurality of carbon nanotubes 12 which is single walled has a diameter of about 0.5 nanometers (nm) to about 50 nm. The plurality of carbon nanotubes 12 which is double walled has a diameter of about 1.0 nm to about 50 nm. The plurality of carbon nanotube 12 which is multi-walled has a diameter of about 1.5 nm to about 50 nm. The plurality of carbon nanotubes 12 has a height of about 100 nm to about 10 millimeters (mm), for example, the height of the plurality of carbon nanotubes 12 is 100 microns, 500 microns, 1000 microns or 5 mm. In one embodiment, the plurality of carbon nanotubes 12 is multi-walled carbon nanotubes and has a height of about 100 microns to about 1000 microns.

Figure 4:
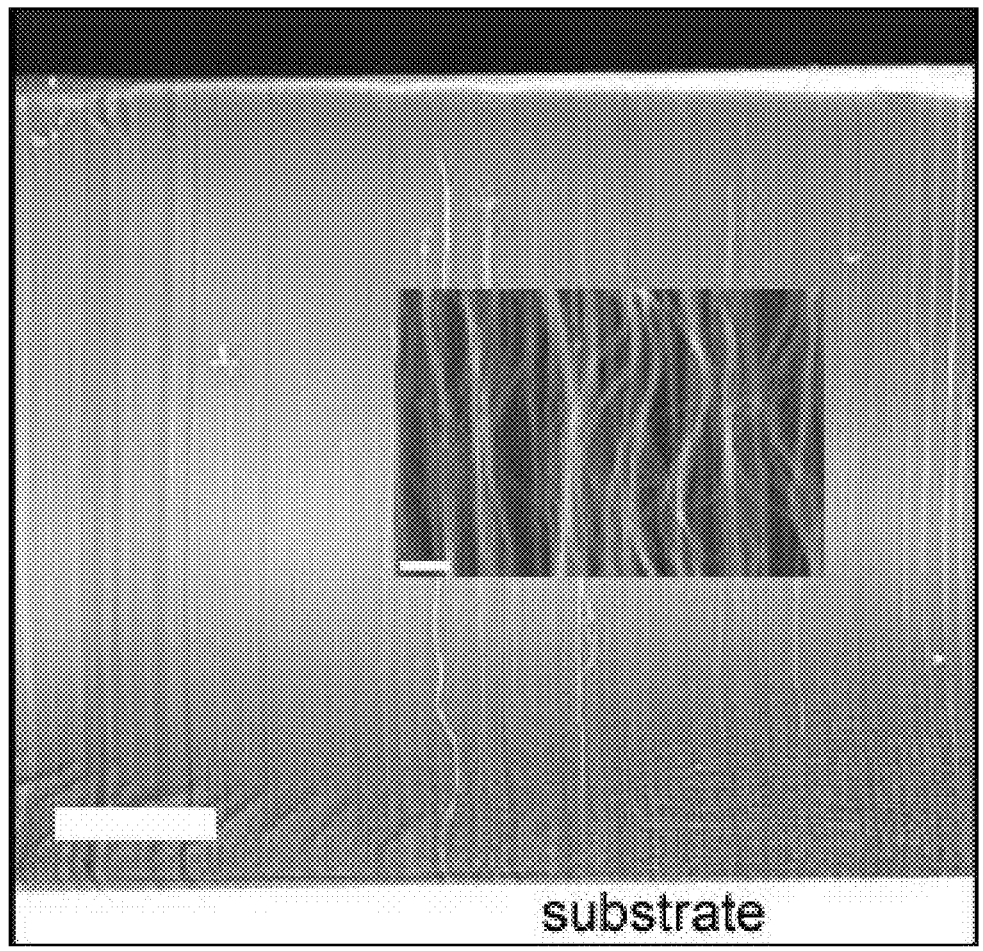
FIG. 4 shows a scanning electron microscope (SEM) image of the carbon nanotube array of FIG. 2.

In step (S1), an angle between the plurality of carbon nanotubes 12 and the surface of the substrate 30 can be in a range from about 10 degrees to about 90 degrees. In one embodiment, the angle between the plurality of carbon nanotubes 12 and the surface of the substrate 30 is in a range from about 60 degrees to about 90 degrees. Referring to FIGS. 3 and 4, in one embodiment, the plurality of carbon nanotubes 12 is perpendicular to the surface of the substrate 30. The plurality of carbon nanotubes 12 includes a top end and a bottom end opposite to the top end. The top ends of the plurality of carbon nanotubes 12 are away from the substrate 30; and the bottom ends of the plurality of carbon nanotubes 12 connect to the surface of the substrate 30.

Figure 5:
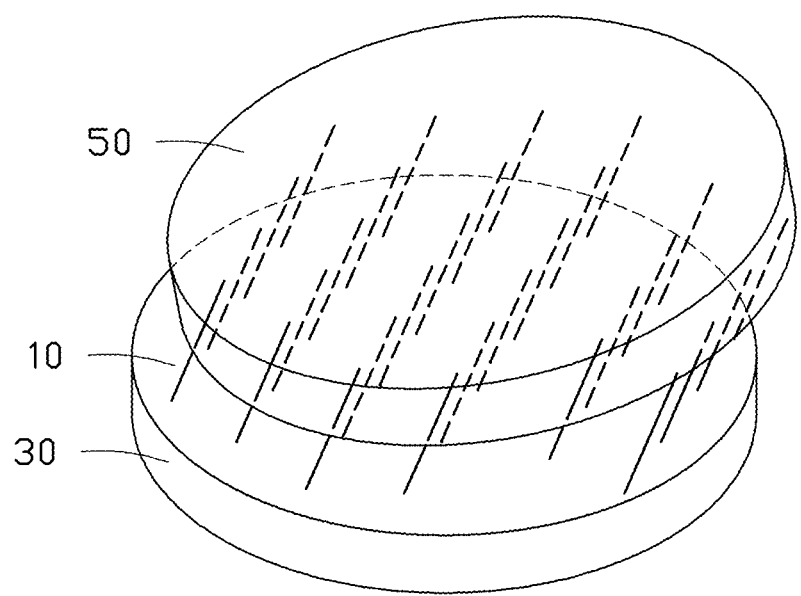
FIG. 5 is a schematic view of pressing the carbon nanotube array of FIG. 2 located on a substrate.

In step (S1), the plurality of carbon nanotubes 12 in the carbon nanotube array 10 is pressed using a compressing apparatus 50, to form the angle between the plurality of carbon nanotubes 12 and the surface of the substrate 30, wherein the angle is less than 90 degrees, as shown in FIG. 5. In detail, a certain pressure can be applied to the carbon nanotube array 10 by the compressing apparatus 50. In one embodiment, the compressing apparatus 50 can be a pressure head having a glossy surface. When a planar pressure head is used to press the carbon nanotube array along a pressing direction slanted to the surface of the substrate 30, the angle between the plurality of carbon nanotubes 12 and the surface of the substrate 30 will be obtained, as shown in FIG. 5. It is to be understood, the pressure and the pressing direction can, opportunely, determine a size of the angle between the plurality of carbon nanotubes 12 and the surface of the substrate 30.

Figure 6:
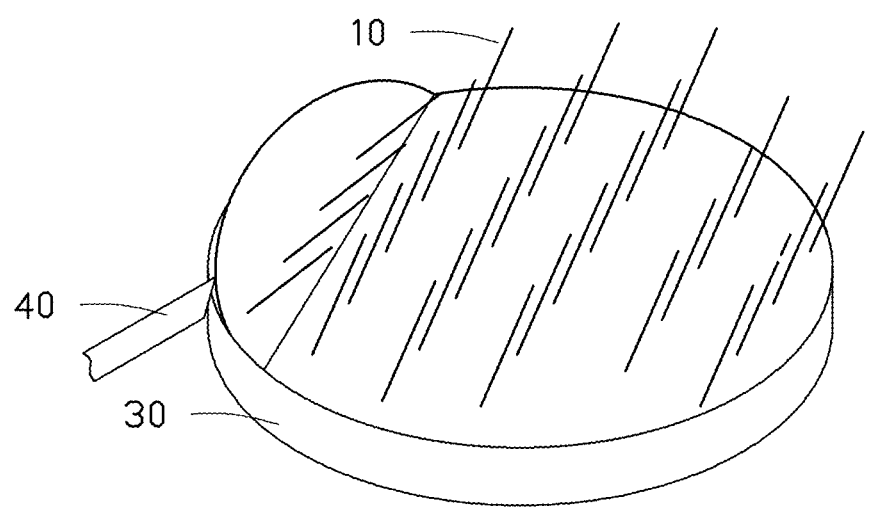
FIG. 6 is a schematic view of scraping the carbon nanotube array of FIG. 2 from a substrate.

In step (S1), the carbon nanotube array 10 can be totally stripped from the substrate 30. In one embodiment, the carbon nanotube array 10 is totally scraped from the substrate 30 by a knife 40 or other similar devices along a direction parallel to the surface of the substrate 30, as shown in FIG. 6. In the process of scraping, adjacent two of the carbon nanotubes 12 join by van der Waals attractive force, therefore, the carbon nanotube array 10 has free-standing structure.

The term "free-standing" includes, but not limited to, the carbon nanotube array 10 that does not have to be supported by the substrate 30. For example, a free-standing carbon nanotube array 10 can sustain itself when it is hoisted by a portion thereof without any significant damage to its structural integrity. So, if the free-standing carbon nanotube array 10 is placed between two separate supporters 14, a portion of the free-standing carbon nanotube array 10, not in contact with the two supporters, would be suspended between the two supporters 14 and yet maintain structural integrity.

The carbon nanotube array 10 stripped from the substrate 30 includes the plurality of carbon nanotubes 12. Angles between the plurality of carbon nanotubes 12 and the top surface 102 of the carbon nanotube array 10 can be in a range from about 10 degrees to about 90 degrees, as shown in FIG. 5. In one embodiment, angles between the plurality of carbon nanotubes 12 and the top surface 102 of the carbon nanotube array 10 is in a range from about 60 degrees to about 90 degrees. In one embodiment, the plurality of carbon nanotubes 12 is perpendicular to the top surface 102 of the carbon nanotube array 10, as shown in FIG. 3.

In step (S1), the carbon nanotube array 10 can be placed between two separate supporters 14 or on a ring base. The ring base can be made of thermal insulating material, for example, calcium carbonate, polystyrene, polyvinyl chloride, polyurethane. In one embodiment, the ring base is made of polystyrene. The carbon nanotube array 10 can be placed on the substrate 30 which is made of light-transparent and thermal insulating material, such as, glass, resin or zinc selenide (ZnSe). In one embodiment, the substrate 30 is made of ZnSe.

Figure 7:
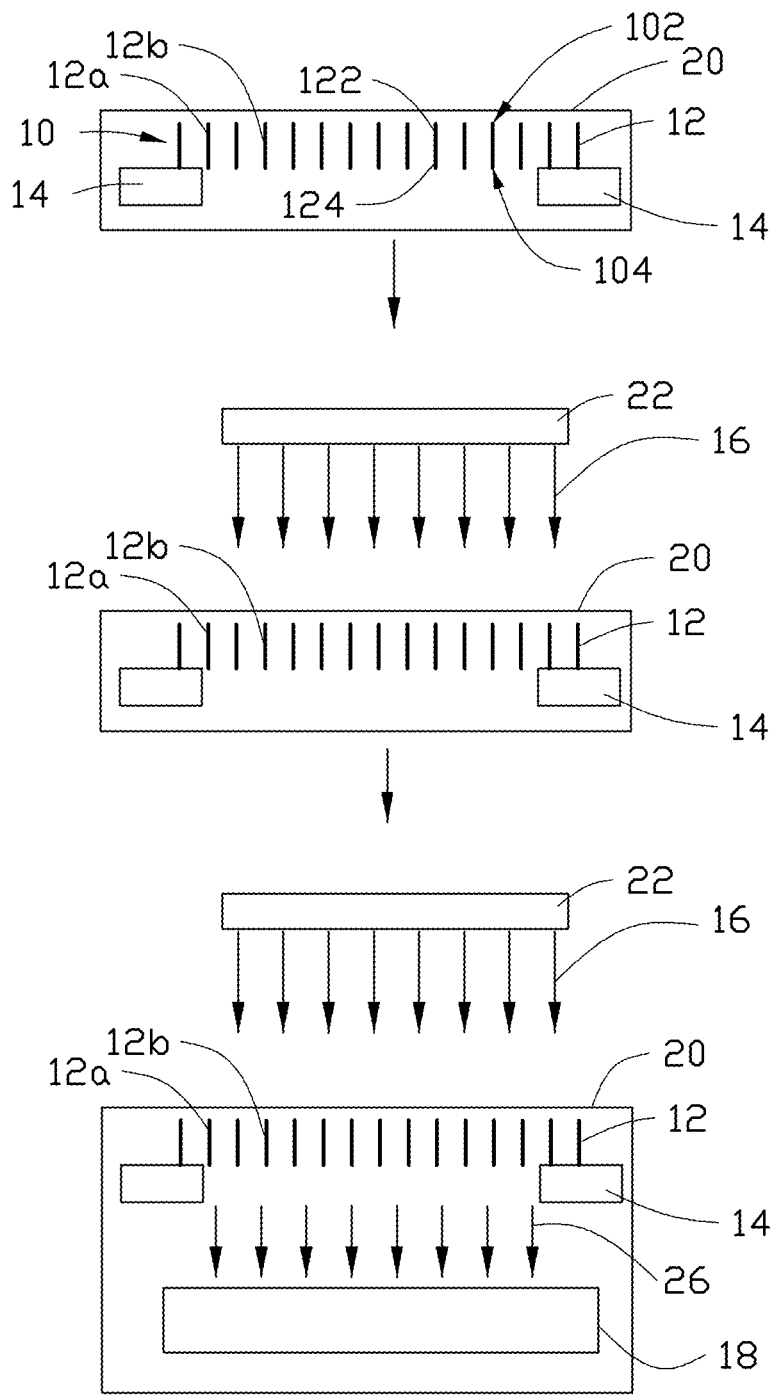
FIG. 7 is a flowchart of another embodiment of a method for measuring light intensity distribution.

In step (S1), the carbon nanotube array 10 can be located in a chamber 20. As shown in FIG. 7, in another embodiment, the carbon nanotube array 10 and the imaging element 18 are placed in the chamber 20. The chamber 20 is made of light-transparent materials, such as glass, resin or zinc selenide (ZnSe). The chamber 20 can be filled with nitrogen, ammonia or inertia gas. In another embodiment, a pressure in the chamber 20 can be in a range from about $10^{-9}$ Pa to about $10^{-3}$ Pa.

In step (S2), the carbon nanotube array 10 has the top surface 102 and a bottom surface 104 opposite to the top surface 102. Each of the plurality of carbon nanotubes 12 has a top end 122 and a bottom end 124 opposite to the top end 122. The top end 122 of each of the carbon nanotubes 12 is close to the light source 22. The bottom end 124 of each of the carbon nanotubes 12 is away from the light source 22. Each of the carbon nanotubes 12 orients along a direction from the bottom surface 104 to the top surface 102 of the carbon nanotube array 10.

The light source 22 can emit infrared light, ultraviolet light. In one embodiment, an infrared light is used as the light source 22.

An irradiating angle of the light source 22 can be selected according to need, which is between a light beam 16 from the light source 22 and the top surface 102 of the carbon nanotube array 10. In one embodiment, the irradiating angle is 90 degrees such that the light beam 16 is substantially vertical to the top surface 102 of the carbon nanotube array 10 and parallel to an axis of each of the carbon nanotubes 12.

While irradiating the top surface 102 of the carbon nanotube array 10 with the light beam 16, the top surface 102 of the carbon nanotube array 10 absorbs photons of the light source 22 and produces heat and radiates radiation light 26, due to carbon nanotube array 10 having an ideal black body structure. The higher the intensity of the light source 22, the more photons that are absorbed by the top surface 102 of the carbon nanotube array 10, the more heat will be produced by the top surface 102, the higher the intensity of the radiation light 26. The plurality of carbon nanotubes 12 has heat conduction anisotropy. Heat is conducted along the axes of the plurality of carbon nanotubes 12 and is hardly conducted along a direction vertical to the axes of the plurality of carbon nanotubes 12. Therefore, the heat of each of the plurality of carbon nanotubes 12 has been conducted along a direction from the top end 122 to the bottom end 124, until each of the plurality of carbon nanotubes 12 has equal and uniform heat. Meanwhile, the carbon nanotube array 10 radiates the radiation light 26, due to carbon nanotube array 10 having the ideal black body structure.

In detail, when the light beam 16 irradiates the top surface 102 of the carbon nanotube array 10, for example, a light with a higher light intensity in the light beam 16 irradiates a top end 122 of a carbon nanotube 12A. The top end 122 of the carbon nanotube 12A absorbs photons of the light source 22 and produces more heat. The heat is conducted along the direction from the top end 122 to the bottom end 124, until the carbon nanotube 12A has equal and uniform heat. A light with a lower light intensity in the light beam 16 irradiates a top end 122 of a carbon nanotube 12B. The top end 122 of the carbon nanotube 12B absorbs photons of the light source 22 and produces less heat. The heat is conducted along the direction from the top end 122 to the bottom end 124, until the carbon nanotube 12B has equal and uniform heat. Heat of the carbon nanotube 12A is more than heat of the carbon nanotube 12B. Meanwhile, the carbon nanotubes 12A and 12B radiate the radiation light 26, due to the plurality of carbon nanotubes 12 having the ideal black body structure. Therefore, a light intensity of the radiation light 26 radiated by the carbon nanotubes 12A is higher than a light intensity of the radiation light 26 radiated by the carbon nanotubes 12B.

Light intensity of the radiation light 26 radiated by each of the plurality of carbon nanotubes 12 in the carbon nanotube array 10 is related to light intensity of the light source 22. The higher the intensity of the radiation light 26 radiated by one of the plurality of carbon nanotubes 12, the more heat will be produced by the top end 122 of the plurality of carbon nanotubes 12, the higher the intensity of one light irradiating the top end 122 of the plurality of carbon nanotubes 12. The radiation light 26 can be infrared light, ultraviolet light, visible light, for example. The type of the radiation light 26 is related to heat produced by the carbon nanotube array 10 and a wavelength of the light beam 16 from the light source 22.

In step (S3), the plurality of carbon nanotubes 12 have heat conduction anisotropy. Heat is conducted along the axes of the plurality of carbon nanotubes 12 and is hardly conducted along a direction vertical to the axes of the plurality of carbon nanotubes 12. Therefore, when the carbon nanotube array 10 radiates radiation light 26, the top surface 102 and the bottom surface 104 of the carbon nanotube array 10 radiates more radiation light 26. Side surfaces of the carbon nanotube array 10 hardly radiate radiation light 26, wherein the side surface is parallel to the axes of the plurality of carbon nanotubes 12. Therefore, the imaging element 18 can be adjacent to the bottom surface 104 of the carbon nanotube array 10. In one embodiment, the plurality of carbon nanotubes 12 of the carbon nanotube array 10 is substantially perpendicular to a surface of the imaging element 18.

The plurality of carbon nanotubes 12 of the carbon nanotube array 10 is substantially parallel to each other. Adjacent two of the carbon nanotubes 12 are still connected to each other. When the light beam 16 irradiates the top surface 102, the light beam 16 does not pass through the interspace between adjacent two of the carbon nanotubes 12 and irradiates the imaging element 18. The imaging element 18 does not receive the light beam 16. The imaging element 18 only receives the radiation light 26 radiated from the carbon nanotube array 10 and image the radiation light 26.

In step (S3), a distance between the imaging element 18 and the top surface 102 of the carbon nanotube array 10 can be in a range from about 1 mm to about 100 mm. In one embodiment, the chamber 20 is between the imaging element 18 and the light source 22. The chamber 20 is separated from the imaging element 18. The imaging element 18 can be a charge-coupled device (CCD), a complementary metal-oxide-semiconductor (CMOS). In one embodiment, the imaging element 18 is a CCD.

After imaging the radiation light 26 radiated from the carbon nanotube array 10 with the imaging element 18, the intensity distribution of the light source 22 can be obtained by reading the imaging element 18. A computer can be used for reading the imaging element 18 to obtain the intensity distribution of the light source 22.

In summary, the method for measuring intensity distribution of light can be at room temperature. The method for measuring intensity distribution of light has higher sensitive and resolution. Moreover, the method for measuring intensity distribution of light is simple and easy to implement.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for measuring intensity distribution of light from a light source comprising:
   (S0) manufacturing a carbon nanotube array comprising a plurality of carbon nanotubes, wherein the carbon nanotube array has a top surface, angles between the plurality of carbon nanotubes and the top surface of the carbon nanotube array are in a range from about 10 degrees to about 90 degrees;
   (S1) suspending the carbon nanotube array in an inert gas environment or a vacuum environment;
   (S2) irradiating the top surface of the carbon nanotube array with light from a light source to make the carbon nanotube array radiate a radiation light; and
   (S3) obtaining an intensity distribution of the light source by imaging the radiation light from the carbon nanotube array with an imaging element.

2. The method of claim 1, wherein the plurality of carbon nanotubes are substantially parallel to each other.

3. The method of claim 2, wherein in the step (S0), the carbon nanotube array is manufactured by the steps of:
   (S01) providing a substrate defining a surface, the surface being substantially flat and smooth;
   (S02) forming a catalyst on the surface of the substrate;
   (S03) annealing the substrate with the catalyst at a temperature ranging from about 700° C. to about 900° C. in air for about 30 minutes to about 90 minutes;
   (S04) heating the substrate with the catalyst at a temperature ranging from about 500° C. to about 740° C. in a furnace with a protective gas therein; and
   (S05) supplying a carbon source gas to the furnace for about 5 minutes to about 30 minutes and growing the carbon nanotube array on the substrate.

4. The method of claim 3, wherein the growing of the carbon nanotube array is controlled so that angles between the plurality of carbon nanotubes and the surface of the substrate are in a range from about 10 degrees to about 90 degrees.

5. The method of claim 4, wherein the angles between the plurality of carbon nanotubes and the surface of the substrate are in a range from about 60 degrees to about 90 degrees.

6. The method of claim 4, the controlling of the angles between the plurality of carbon nanotubes and the surface of the substrate is achieved by pressing the plurality of carbon nanotubes with a compressing apparatus to desired angles between the plurality of carbon nanotubes and the surface of the substrate.

7. The method of claim 3, further comprises step (S06) stripping the carbon nanotube array from the substrate.

8. The method of claim 7, the stripping of the carbon nanotube array is achieved by scraping the carbon nanotube array from the substrate along a direction parallel to the surface of the substrate.

9. The method of claim 8, further comprises step (S07) forming the carbon nanotube array scraped from the substrate into a free-standing structure by joining adjacent two of the plurality of carbon nanotubes by van der Waals attractive force.

10. The method of claim 2, wherein the angle between the plurality of carbon nanotubes and the top surface of the carbon nanotube array is in a range from about 60 degrees to about 90 degrees.

11. The method of claim 10, wherein the plurality of carbon nanotubes is perpendicular to the top surface of the carbon nanotube array.

12. The method of claim 1, wherein in the step (S1), the carbon nanotube array is placed in a chamber made of light-transparent materials.

13. The method of claim 12, wherein in the step (S1) the chamber is filled with nitrogen, ammonia or inert gas.

14. The method of claim 12, wherein a pressure in the chamber is in a range from about $10^{-9}$ Pa to about $10^{-3}$ Pa.

15. The method of claim 1, wherein in the step (S2) the light source is infrared light or ultraviolet light.

16. The method of claim 2, wherein in the step (S2), the top surface of the carbon nanotube arrays is irradiated at an irradiating angle of 90 degrees, the irradiating angle is defined between a light beam from the light source and the top surface of the carbon nanotube array.

17. The method of claim 16, wherein the light beam is substantially vertical to the top surface of the carbon nanotube array and parallel to axes of the plurality of carbon nanotubes.

18. The method of claim 1, wherein in the step (S3) a distance between the imaging element and the top surface of the carbon nanotube array is in a range from about 1 mm to about 100 mm.

19. The method of claim 12, wherein the step (S1) comprises placing the chamber between the imaging element and the light source.

20. A method for measuring intensity distribution of light comprising:

(S1) suspending a carbon nanotube array comprising a plurality of carbon nanotubes in an inert gas environment or a vacuum environment, wherein the carbon nanotube array has a top surface, angles between the plurality of carbon nanotubes and the top surface of the carbon nanotube array are in a range from about 10 degrees to about 90 degrees;

(S2) irradiating the top surface of the carbon nanotube array with a light source to make the carbon nanotube array radiate a radiation light; and (S3) imaging the radiation light with the imaging element to obtain an intensity distribution of the light source, wherein the imaging element is placed in the inert gas environment or the vacuum environment.

* * * * *